(12) United States Patent
Nikitin et al.

(10) Patent No.: US 7,082,593 B2
(45) Date of Patent: Jul. 25, 2006

(54) METHOD AND APPARATUS OF IC IMPLEMENTATION BASED ON C++ LANGUAGE DESCRIPTION

(75) Inventors: Andrey A. Nikitin, Moscow (RU); Alexander E. Andreev, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 426 days.

(21) Appl. No.: 10/621,737

(22) Filed: Jul. 17, 2003

(65) Prior Publication Data

US 2005/0013155 A1    Jan. 20, 2005

(51) Int. Cl.
*G06F 17/50*    (2006.01)
(52) U.S. Cl. ........................................... 716/18
(58) Field of Classification Search ................. 716/18
See application file for complete search history.

(56) References Cited

U.S. PATENT DOCUMENTS

| 5,537,329 | A | * | 7/1996 | Feldmann et al. | 716/4 |
| 5,764,531 | A | * | 6/1998 | Kojima et al. | 716/6 |
| 5,926,397 | A | * | 7/1999 | Yamanouchi | 716/14 |
| 6,425,110 | B1 | * | 7/2002 | Hathaway et al. | 716/2 |

* cited by examiner

*Primary Examiner*—Vuthe Siek
*Assistant Examiner*—Brandon Bowers
(74) *Attorney, Agent, or Firm*—Suiter West Swantz PC LLO

(57) ABSTRACT

The present invention is directed to a method and apparatus of IC implementation based on a C++ language description. In an exemplary aspect of the present invention, a method for evaluating a C++ description by an IC includes the following steps. First, a C++ description including a C++ program is provided. Then, the C++ program is stored in a first memory module (e.g., a ROM, or the like) of an IC. Next, a scalar input and/or an input array may be provided to the IC. Then, the C++ program may be executed by a control device module of the IC. Next, a scalar output and/or an output array may be read from the IC.

18 Claims, 3 Drawing Sheets

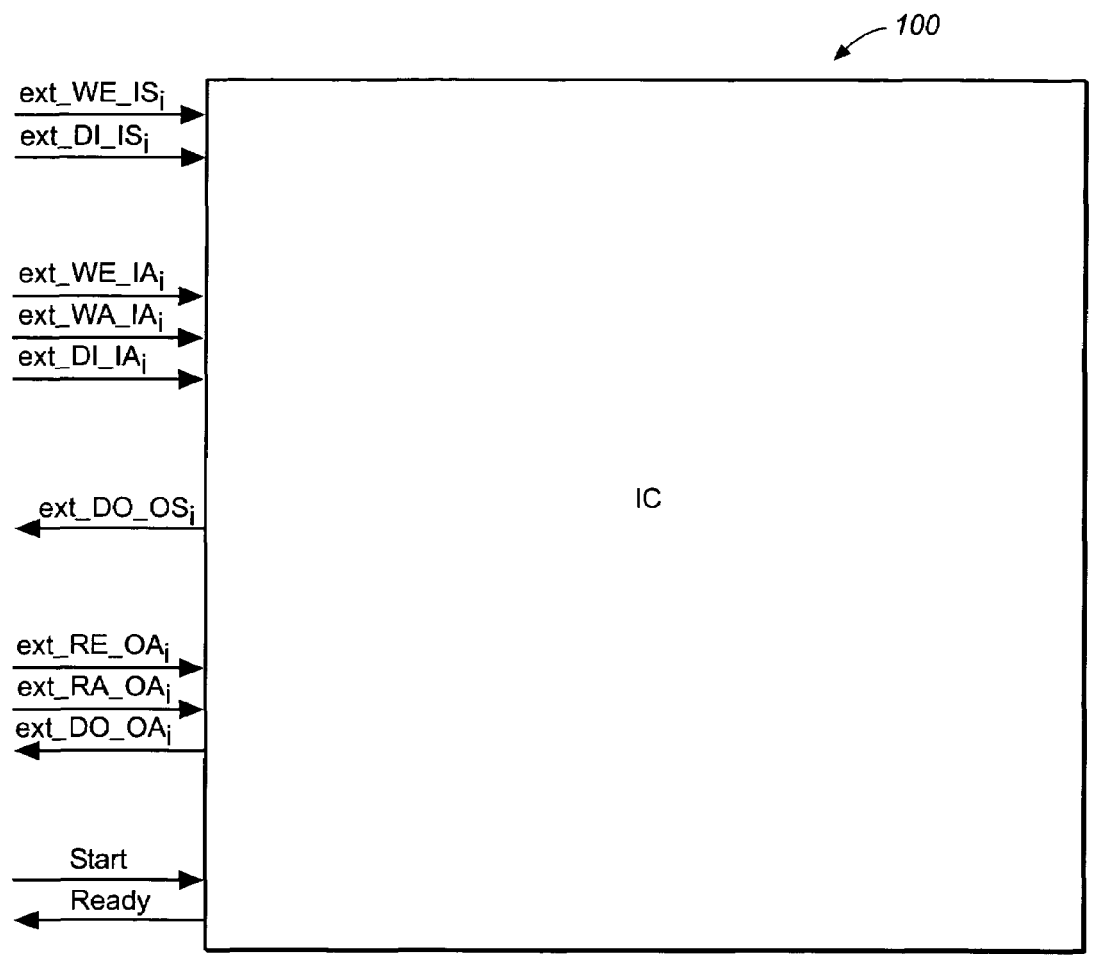
FIG._1

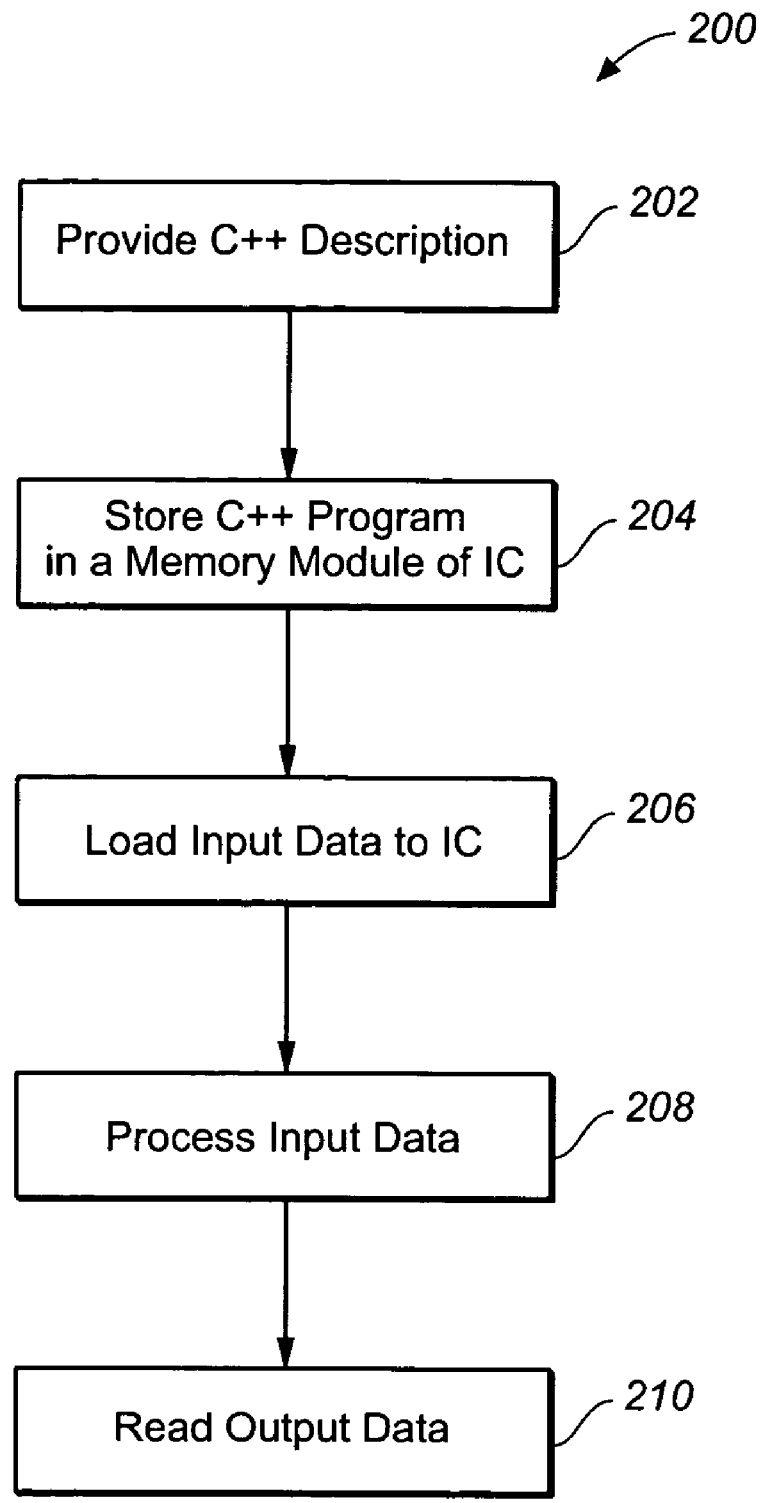
FIG._2

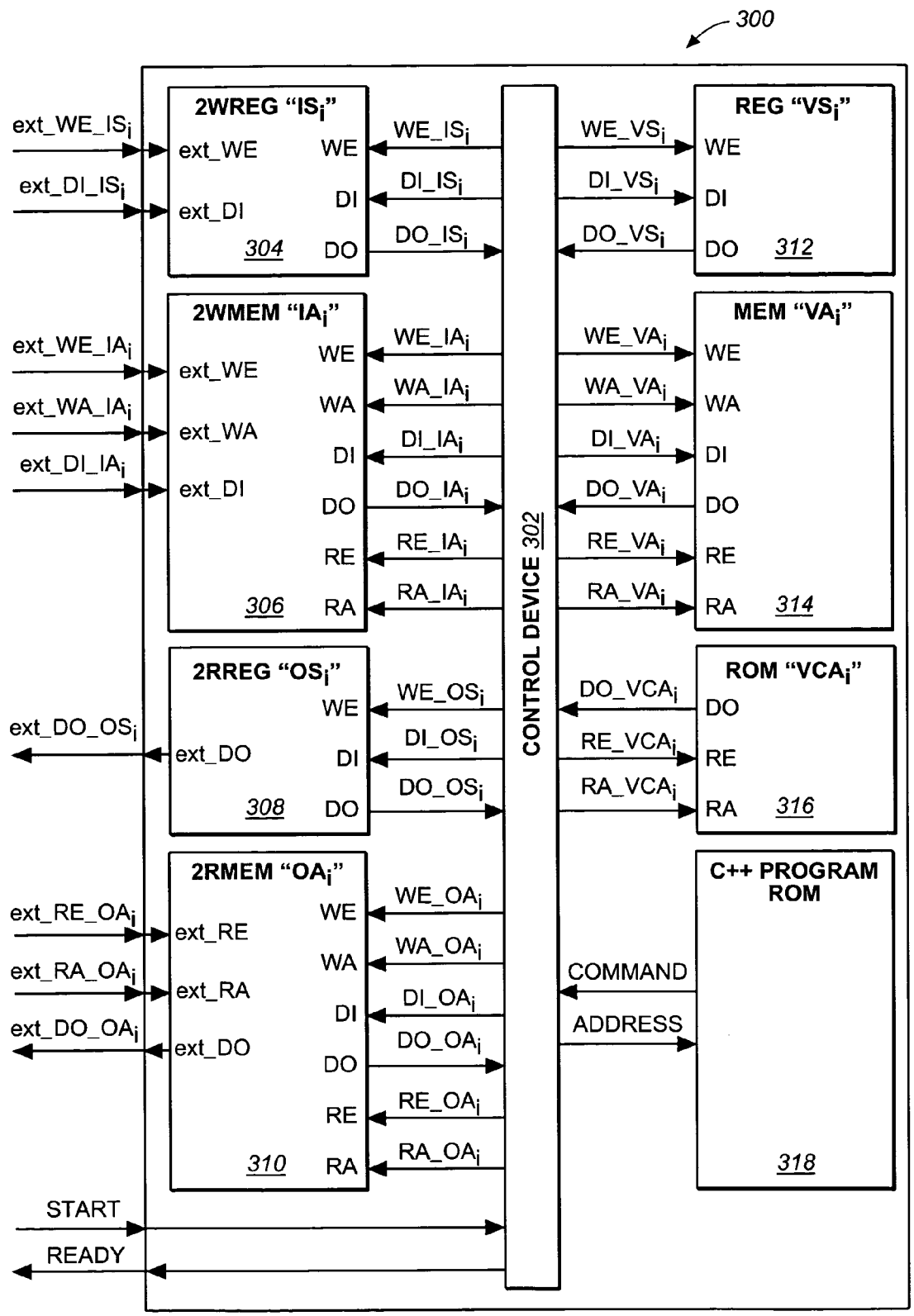
FIG._3

METHOD AND APPARATUS OF IC IMPLEMENTATION BASED ON C++ LANGUAGE DESCRIPTION

FIELD OF THE INVENTION

The present invention generally relates to the field of integrated circuit (IC) design, and particularly to a method and apparatus of IC implementation based on a C++ language description.

BACKGROUND OF THE INVENTION

Integrated circuits (ICs) are developed in order to process information. Every IC has some inputs (or input ports) and some outputs (or output ports). The IC receives input data, processes the data and then outputs the results. At the stage of IC development, the algorithm (or set of rules) that determines the instructions for processing the data is usually described by means of a high-level description language such as C++, RTL Verilog, or the like. Therefore, it would be desirable to provide a method and apparatus of IC implementation based on a C++ language description to evaluate the C++ language description.

SUMMARY OF THE INVENTION

Accordingly, the present invention is directed to a method and apparatus of IC implementation based on a C++ language description. In a first exemplary aspect of the present invention, a method for evaluating a C++ description by an IC includes the following steps. First, a C++ description including a C++ program is provided. Then, the C++ program is stored in a first memory module (e.g., a ROM, or the like) of an IC. Next, a scalar input and/or an input array may be provided to the IC. Then, the C++ program may be executed by a control device module of the IC. Next, a scalar output and/or an output array may be read from the IC.

In a further exemplary aspect of the present invention, an IC for evaluating a C++ description including a C++ program includes a first memory module (e.g., a ROM, or the like) for storing a C++ program, a plurality of memory modules for storing values of different inputs, outputs, and variables separately, and a control device module communicatively coupled to the first memory module and each of a plurality of memory modules for executing the C++ program and for managing reading/writing of values of different inputs, outputs and variables.

It is to be understood that both the foregoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which:

FIG. 1 is a schematic diagram showing inputs and outputs of an exemplary integrated circuit for implementing a C++ description in accordance with an exemplary embodiment of the present invention;

FIG. 2 illustrates an exemplary process of evaluating a C++ description by an IC in accordance with an exemplary embodiment of the present invention; and FIG. 3 is a schematic block diagram showing an exemplary integrated circuit for implementing a C++ description in accordance with an exemplary embodiment of the present invention.

DETAILED DESCRIPTION OF THE INVENTION

Reference will now be made in detail to the presently preferred embodiments of the invention, examples of which are illustrated in the accompanying drawings.

A. Definition of "a C++ Description"

A C++ description (or a C++ language description) is a program written in C++ programming language that provides an evaluation of output values if input values are known. A simple example of such a C++ description is shown as follows.

```
INPUT<unsigned> x[10];
OUTPUT<unsigned>y;
const unsigned power_of_2[10] = {1,2,4,8,16,32,64,128,256,512};
unsigned i;
void main( ){
    y=0;
    for (i=0;i<10;i++){
        if (x[i]==1){
            y = y + power_of_2[i];
        }
    }
}
```

The foregoing-described C++ program describes an IC that has an input array x[10] and an output y. Assume each element x[i], i=0, 1, ..., 9, of the input array x[10] takes values 0 and 1 only. It is easy to understand that the C++ program evaluates the value of the output y such that x[9] x[8] x[7] ... x[0] is the presentation of y in binary mode $$\left(y = \sum_{i=0}^{9} 2^i x[i]\right).$$

A definition of the "C++ description" in general case may be given as follows. A C++ description of an IC includes: (1) inputs and outputs declaration; and (2) a C++ program that takes the values of inputs and evaluates the values of outputs. Inputs and outputs may be of one of two types: scalar and array. In the foregoing-described example, the input x[10] is an input array, and the output y is a scalar output. The C++ program is allowed to use variables for keeping intermediate data. These variables can be of one of three types: scalar (e.g., "i" in the foregoing example), array, and constant array (e.g., "power_of_2" in the foregoing example). In a preferred embodiment of the present invention, all input arrays, output arrays, variable arrays and constant arrays are one-dimensional (i.e., the use of two-, three- or more dimensional arrays is not allowed).

Denote all scalar inputs $IS_i$, $i=\overline{1,ISN}$, where ISN is the number of scalar inputs. Denote all input arrays $IA_i[IAD_i]$, $i=\overline{1,IAN}$, where IAN is the number of input arrays, and $IAD_i$ is the length of the i-th input array. Denote all scalar outputs $OS_i$, $i=\overline{1,OSN}$, where OSN is the number of scalar outputs.

Denote all output arrays $OA_i[OAD_i]$, $i=\overline{1,OAN}$, where OAN is the number of output arrays, and $OAD_i$ is the length of the i-th output array. Denote all scalar variables $VS_i$, $i=\overline{1,VSN}$, where VSN is the number of scalar outputs. Denote all variable arrays $VA_i[VAD_i]$, $i=\overline{1,VAN}$, where VAN is the number of variable arrays, and $VAD_i$ is the length of the i-th variable array. Denote all constant arrays $VCA_i[VCAD_i]$, $i=\overline{1,VCAN}$, where VCAN is the number of constant arrays, and $VCAD_i$ is the length of the i-th constant array.

A C++ description that determines an IC is any C++ program that uses $IS_i$, $IA_i$, $OS_i$, $OA_i$, $VS_i$, $VA_i$, and $VCA_i$ only. In the foregoing example, the following are true:

ISN=0,
IAN=1, $IA_1$=x, $IAD_1$=10,
OSN=1, $OS_1$=y,
OAN=0,
VSN=1, $VS_1$=i,
VAN=0,
VCAN=1, $VCA_1$=power_of_2, $VCAD_1$=10.

B. Inputs and Outputs of IC to Implement C++ Description

FIG. 1 is a schematic diagram showing inputs (or input ports) and outputs (or output ports) of an exemplary integrated circuit (IC) 100 for implementing a C++ description in accordance with an exemplary embodiment of the present invention. The IC 100 may have input and output ports shown as follows.

(a) For Scalar Input

For each scalar input $IS_i$, $i=\overline{1,ISN}$, the IC has 2 input ports: (1) ext_WE_$IS_i$ that takes values 0 and 1 only (WE refers to "Write Enabled"); and (2) ext_DI_$IS_i$ (DI refers to "Data Input").

(b) For Input Array

For each input array $IA_i[IAD_i]$, $i=\overline{1,IAN}$, the IC has 3 input ports: (1) ext_WE_$IA_i$ that takes values 0 and 1 only; (2) ext_WA_$IA_i$ that takes values 0, 1, . . . , ($IAD_i$−1) only (WA refers to "Write Address"); and (3) ext_DI_$IA_i$.

(c) For Scalar Output

For each scalar output $OS_i$, $i=\overline{1,OSN}$, the IC has 1 output port: ext_DO_$OS_i$ (DO refers to "Data Output").

(d) For Output Array

For each output array $OA_i[OAD_i]$, $i=\overline{1,OAN}$, the IC has 2 inputs and 1 output: (1) input ext_RE_$OA_i$ that takes values 0 and 1 only (here and everywhere later RE means "Read Enabled"); (2) input ext_RA_$OA_i$ that takes values 0, 1, . . . , ($OAD_i$−1) only (RA refers to "Read Address"); and output ext_DO_$OA_i$.

(e) START Input and READY Output

The IC includes an input port START that takes values 0 and 1 only, wherein the value 1 at START may trigger execution of a C++ program. The IC also includes an output port READY that takes values 0 and 1 only, wherein the value 0 preferably indicates that the IC is busy executing a C++ program and thus is not available (not READY), and the value 1 preferably indicates the IC is not executing a C++ program and is thus available (READY).

C. Evaluating a C++ Description by an IC

FIG. 2 illustrates an exemplary process 200 of evaluating a C++ description by an IC in accordance with an exemplary embodiment of the present invention. The process 200 may start with step 202 in which a C++ description including a C++ program is provided. Next, in step 204, the C++ program may be stored into a ROM (read-only-memory) of the IC. It is understood that any memory as may be contemplated by a person of ordinary skill in the art may be used to store the C++ program without departing from the scope and spirit of the present invention.

Then in step 206, input data may be loaded to the IC. For each scalar input $IS_i$, $i=\overline{1,ISN}$, its value A is preferably loaded when ext_WE_$IS_i$=1 and ext_DI_$IS_i$=A are assigned. When ext_WE_$IS_i$=0 is assigned, then the value of the scalar input $IS_i$ is not loaded. For each input array $IA_i[IAD_i]$, $i=\overline{1,IAN}$, the value A to the B-th element of input array may be preferably loaded when ext_WE_$IA_i$=1, ext_WA_$IA_i$=B, and ext_DI_$IA_i$=A are assigned. When ext_WE_$IA_i$=0 is assigned, then the value of the input array $IA_i[IAD_i]$ is not loaded. Additionally, if one wants to load the values of all the elements of the input array $IA_i[IAD_i]$, one may preferably load these values for each element separately during $IAD_i$ clock cycles. For example, at the clock cycle 1 the value of the 1-st element may be loaded, at the clock cycle 2 the value of the 2-nd element may be loaded, and so on.

Next in step 208, the loaded input data to the IC may be processed according to the stored C++ program. In a preferred embodiment, when a value "1" is assigned to a START port of the IC, the IC starts the process of processing the input data. At any other time, a value "0" is assigned to the START port. While the IC is processing the input data, the IC generates a value "0" at its output READY. While the IC is not processing the input data, the IC generates a value "1" at its output READY (as soon as the IC finishes the data processing, the output READY takes value 1).

Then in step 210, output data may be read. For each scalar output $OS_i$, $i=\overline{1,OSN}$, the value of this output is preferably generated at the output ext_DO_$OS_i$. For each output array $OA_i[OAD_i]$, if one wants to get the value of its B-th element, one may assign values of inputs ext_RE_$OA_i$=1, and ext_RA_$OA_i$=B (then at the next clock cycle one may get the required value at the output ext_DO_$OA_i$). If one wants to get the values of all elements of the output array $OA_i[OAD_i]$, the values of each element may be preferably read separately. That is, these values may be read during $OAD_i$ clock cycles. For example, at the clock cycle 1 the value of the 1-st element may be read, at the clock cycle 2 the value of the 2-nd element may be read, and so on. When ext_RE_$OA_i$=0 is assigned, then the values of output array $OA_i[OAD_i]$ are not read.

D. Memory Modules of IC

According to an exemplary aspect of the present invention, the IC used to evaluate a C++ description may include seven memory modules shown as follows.

(a) Module MEM(a)

MEM(a) is a memory module that may store a $\geq 1$ unsigned values. It has 5 inputs: WE, WA, DI, RE, RA, and 1 output DO (see, e.g., MEM "$VA_i$" 314 in FIG. 3). The inputs WE and RE take values 0 and 1 only. The inputs WA and RA take one of the values: 0, 1, . . . , (a−1).

If one wants to write the value A to the B-th element in the memory, WE=1, WA=B, and DI=A may be assigned; otherwise, WE=0 may be assigned.

If one wants to read the value of the B-th element in the memory, RE=1 and RA=B may be assigned (then at the next clock cycle the required value may be generated at the output DO). If one does not want to read the memory, then RE=0 may be assigned.

In a preferred embodiment, read (e.g., RE=1) and write (e.g., WE=1) are not simultaneously performed.

(b) Module 2WMEM(a)

Like a module MEM(a), this module 2WMEM(a) may store a$\geq$1 unsigned values. A module 2WMEM(a) has 8 inputs: WE, WA, DI, ext_WE, ext_WA, ext_DI, RE, RA, and 1 output DO (see, e.g., 2WMEM "$IA_i$" 306 in FIG. 3).

The inputs WE, ext_WE and RE take values 0 and 1 only. The inputs WA, ext_WA and RA take one of the values 0, 1, . . . , (a−1).

If one wants to write the value A to the B-th element in the memory, one may do it in two ways: (1) assign WE=1, WA=B, and DI=A; or (2) assign ext_WE=1, ext_WA=B, and ext_DI=A.

If one wants to read the value of the B-th element in the memory, one may assign RE=1, RA=B (then at the next clock cycle the required value may be generated at the output DO). If one does not want to read the memory, then one may assign RE=0.

In a preferred embodiment, it is prohibited to make any 2 of next 3 assignments simultaneously: WE=1, ext_WE=1, and RE=1 (or it is not allowed to make 2 writings or to make both reading and writing at the same clock cycle).

(c) Module 2RMEM(a)

Like a module MEM(a), this module 2RMEM(a) may store a ≧1 unsigned values. A module 2RMEM(a) has 7 inputs: WE, WA, DI, RE, RA, ext_RE, ext_RA, and 2 outputs: DO and ext_DO (see, e.g., 2RMEM "OA$_i$" 310 in FIG. 3). The inputs WE, ext_RE and RE take values 0 and 1 only. The inputs WA, ext_RA and RA take one of the values 0, 1, . . . , (a−1).

If one wants to write the value A to the B-th element in the memory, one may assign WE=1, WA=B, and DI=A; otherwise one may assign WE=0.

If one wants to read the value of the B-th element in the memory, one may do it in 2 ways: (1) assign RE=1, and RA=B (then at the next clock cycle the required value may be generated at the output DO); or (2) assign ext_RE=1, ext_RA=B (then at the next clock cycle the required value may be generated at the output ext_DO).

In a preferred embodiment, it is prohibited to make any 2 of next 3 assignments simultaneously: WE=1, ext_RE=1, and RE=1 (or it is not allowed to make 2 readings or to make both reading and writing at the same clock cycle).

(d) Module ROM(a)

A module ROM(a) is a memory module that may store a ≧1 unsigned constant values. It has 2 inputs: RE, RA and 1 output DO (see, e.g., ROM "VCA$_i$" 316 in FIG. 3). The input RE takes values 0 and 1 only. The input RA takes one of the values: 0, 1, . . . , (a−1).

If one wants to read the value of the B-th element in the memory, one may assign RE=1 and RA=B (then at the next clock cycle the required value may be generated at the output DO). If one does not want to read the memory, then one may assign RE=0.

(e) Module REG

A module REG is a memory module that may store one unsigned value. It has 2 inputs: WE, DI and 1 output DO (see, e.g., REG "VS$_i$" 312 in FIG. 3). The input WE takes values 0 and 1 only.

If one wants to write the value A to the memory, one may assign WE=1 and DI=A; otherwise one may assign WE=0.

The stored value may be generated on the output DO at any time.

(f) Module 2WREG

A module 2WREG is a memory module that may store one unsigned value. It has 4 inputs: WE, DI, ext_WE, ext_DI, and 1 output DO (see, e.g., 2WREG "IS$_i$" 304 in FIG. 3). The inputs WE and ext_WE take values 0 and 1 only.

If one wants to write the value A to the memory, one may do it in 2 ways: (1) assign WE=1 and DI=A; or (2) assign ext_WE=1 and ext_DI=A.

The stored value may be generated on the output DO at any time.

(g) Module 2RREG

A module 2RREG is a memory module that may store one unsigned value. It has 2 inputs: WE, DI and 2 outputs: DO and ext_DO (see, e.g., 2RREG "OS$_i$" 308 in FIG. 3). The input WE takes values 0 and 1 only.

If one wants to write the value A to the memory, one may assign WE=1 and DI=A; otherwise, one may assign WE=0.

The stored value may be generated on the outputs DO and ext_DO at any time.

E. Structure of IC for Evaluating C++ Description

FIG. 3 is a schematic block diagram showing an exemplary integrated circuit 300 for implementing a C++ description in accordance with an exemplary embodiment of the present invention. The IC 300 includes the same input and output ports as shown in FIG. 1. In addition, the IC 300 includes a module CONTROL DEVICE 302, a memory module 2WREG "IS$_i$" 304 (an example of the foregoing-described module 2WREG), a memory module 2WMEM "IA$_i$" 306 (an example of the foregoing-described module 2WMEM(a)), a memory module 2RREG "OS$_i$" 308 (an example of the foregoing-described module 2RREG), a memory module 2RMEM "OA$_i$" 310 (an example of the foregoing-described module 2RMEM(a)), a memory module REG "VS$_i$" 312 (an example of the foregoing-described module REG), a memory module MEM "VA$_i$" 314 (an example of the foregoing-described module MEM(a)), a memory module ROM "VCA$_i$" 316 (an example of the foregoing-described module ROM(a)), and a C++ PROGRAM ROM 318. The process 200 shown in FIG. 2 may be performed in the IC 300.

(a) For Each Scalar Input IS$_i$, i=$\overline{1,ISN}$

The module CONTROL DEVICE 302 includes 2 outputs: WE_IS$_i$ and DI_IS$_i$, and 1 input DO_IS$_i$. By means of these ports, the module CONTROL DEVICE 302 manages reading and writing (reading/writing) of the scalar input IS$_i$.

The IC 300 includes the module 2WREG "IS$_i$" 304. The inputs ext_WE and ext_DI of this module 304 are connected to the inputs ext_WE_IS$_i$ and ext_DI_IS$_i$ of the IC 300, respectively. The inputs WE and DI of this module 304 are connected to the outputs WE_IS$_i$ and DI_IS$_i$ of the module CONTROL DEVICE 302, respectively. The output DO of this module 304 is connected to the input DO_IS$_i$ of the module CONTROL DEVICE 302.

(b) For Each Input Array IA$_i$[IAD$_i$], i=$\overline{1,IAN}$

The module CONTROL DEVICE 302 includes 5 outputs: WE_IA$_i$, WA_IA$_i$, DI_IA$_i$, RE_IA$_i$ and RA_IA$_i$, and 1 input DO_IA$_i$. By means of these ports the module CONTROL DEVICE 302 manages reading/writing of the input array IA$_i$[IAD$_i$].

The IC 300 includes the module 2WMEM(IAD$_i$) "IA$_i$" 306. The inputs ext_WE, ext_WA and ext_DI of this module 306 are connected to the inputs ext_WE_IA$_i$, ext_WA_IA$_i$ and ext_DI_IA$_i$ of the IC 300, respectively. The inputs WE, WA, DI, RE and RA of this module 306 are connected to the outputs WE_IA$_i$, WA_IA$_i$, DI_IA$_i$, RE_IA$_i$ and RA_IA$_i$ of the module CONTROL DEVICE 302, respectively. The output DO of this module 306 is connected to the input DO_IA$_i$ of the module CONTROL DEVICE 302.

(c) For Each Scalar Output OS$_i$, i=$\overline{1,OSN}$

The module CONTROL DEVICE 302 includes 2 outputs: WE_OS$_i$ and DI_OS$_i$, and 1 input DO_OS$_i$. By means of these ports the module CONTROL DEVICE 302 manages reading/writing of the scalar output OS$_i$.

The IC 300 includes the module 2RREG "$OS_i$," 308. The output ext_DO of this module 308 is connected to the output ext_DO_OS$_i$ of the IC 300. The inputs WE and DI of this module 308 are connected to the outputs WE_OS$_i$ and DI_OS$_i$ of the module CONTROL DEVICE 302, respectively. The output DO of this module 308 is connected to the input DO_OS$_i$ of the module CONTROL DEVICE 302.

(d) For Each Output Array OA$_i$[OAD$_i$], i=$\overline{1,OAN}$

The module CONTROL DEVICE 302 includes 5 outputs: WE_OA$_i$, WA_OA$_i$, DI_OA$_i$, RE_OA$_i$ and RA_OA$_i$, and 1 input DO_OA$_i$. By means of these ports the module CONTROL DEVICE 302 manages reading/writing of the output array OA$_i$[OAD$_i$].

The IC 300 includes the module 2RMEM(OAD$_i$) "OA$_i$," 310. The inputs ext_RE and ext_RA of this module 310 are connected to the inputs ext_RE_OA$_i$ and ext_RA_OA$_i$ of the IC 300, respectively. The output ext_DO of this module 310 is connected to the output ext_DO_OA$_i$ of the IC 300. The inputs WE, WA, DI, RE and RA of this module 310 are connected to the outputs WE_OA$_i$, WA_OA$_i$, DI_OA$_i$, RE_OA$_i$ and RA_OA$_i$ of the module CONTROL DEVICE 302, respectively. The output DO of this module 310 is connected to the input DO_OA$_i$ of the module CONTROL DEVICE 302.

(e) For Each Scalar Variable VS$_i$, i=$\overline{1,VSN}$

The module CONTROL DEVICE 302 includes 2 outputs: WE_VS$_i$ and DI_VS$_i$, and 1 input DO_VS$_i$. By means of these ports the module CONTROL DEVICE 302 manages reading/writing of the scalar variable VS$_i$.

The IC 300 includes the module REG "VS$_i$," 312. The inputs WE and DI of this module 312 are connected to the outputs WE_VS$_i$ and DI_VS$_i$ of the module CONTROL DEVICE 302, respectively. The output DO of this module 312 is connected to the input DO_VS$_i$ of the module CONTROL DEVICE 302.

(f) For Each Variable Array VA$_i$[VAD$_i$], i=$\overline{1,VAN}$

The module CONTROL DEVICE 302 includes 5 outputs: WE_VA$_i$, WA_VA$_i$, DI_VA$_i$, RE_VA$_i$ and RA_VA$_i$, and 1 input DO_VA$_i$. By means of these ports the module CONTROL DEVICE 302 manages reading/writing of the variable array VA$_i$[VAD$_i$].

The IC 300 includes the module MEM(VAD$_i$) "VA$_i$," 314. The inputs WE, WA, DI, RE and RA of this module 314 are connected to the outputs WE_VA$_i$, WA_VA$_i$, DI_VA$_i$, RE_VA$_i$ and RA_VA$_i$ of the module CONTROL DEVICE 302, respectively. The output DO of this module 314 is connected to the input DO_VA$_i$ of the module CONTROL DEVICE 302.

(g) For Each Constant Array VCA$_i$[VCAD$_i$], i=$\overline{1,VCAN}$

The module CONTROL DEVICE 302 includes 2 outputs: RE_VCA$_i$ and RA_VCA$_i$, and 1 input DO_VCA$_i$. By means of these ports the module CONTROL DEVICE 302 manages reading of the constant array VCA$_i$[VCAD$_i$].

The IC 300 includes the module ROM(VCAD$_i$) "VCA$_i$," 316. The inputs RE and RA of this module 316 are connected to the outputs RE_VCA$_i$ and RA_VCA$_i$ of the module CONTROL DEVICE 302, respectively. The output DO of this module 316 is connected to the input DO_VCA$_i$ of the module CONTROL DEVICE 302.

(h) Control Device

The main module of the IC 300 is the CONTROL DEVICE module 302. The module CONTROL DEVICE 302 works like a finite-state machine. Preferably, the CONTROL DEVICE module 302 starts execution of the C++ program as soon as the input START of the CONTROL DEVICE (this input is connected to the input START of the IC 300) takes value 1. This module 302 executes the C++ program step-by-step, command-by-command. The C++ program is preferably stored in the module C++ PROGRAM ROM (ready-only memory) 318. Those of ordinary skill in the art will appreciate that a memory module that is not ROM may also be used to store the C++ program without departing from the scope and spirit of the present invention. The CONTROL DEVICE 302 generates the value of output ADDRESS (see FIG. 3). This value is the number of command that should be performed by CONTROL DEVICE 302. The module C++ PROGRAM ROM 318 outputs the command COMMAND based on the address ADDRESS. Next, the CONTROL DEVICE 302 executes the command COMMAND. During the execution, the CONTROL DEVICE 302 also manages the memories (MEM) and registers (REG) to perform read and write operations by means of inputs and outputs connected to the correspondent MEM and REG modules that are described above. In parallel, the CONTROL DEVICE 302 calculates the ADDRESS of the command that should be performed at the next clock cycle. While the CONTROL DEVICE 302 executes the C++ program, the CONTROL DEVICE 302 generates a value "0" at the output READY of the IC 300. When the CONTROL DEVICE 302 finishes the execution, the CONTROL DEVICE 302 generates a value "1" at the output READY of the IC 300.

(i) C++ PROGRAM ROM

The module C++ PROGRAM ROM 318 stores the C++ program to be executed by the CONTROL DEVICE module 302. The C++ program may be stored in the ROM 318 in two ways. In one embodiment, the C++ program may be translated into a program including low-level programming language commands such as commands of Assembler programming language, or the like. This method may be advantageous because the CONTROL DEVICE 302 that executes these small commands is simple enough so that the CONTROL DEVICE 302 may be easily created. On the other hand, the disadvantage is that the "Assembler" program is much longer than the C++ program. Thus, execution of the "Assembler" program by the IC 300 may require more time than execution of the C++ program, and the ROM volume required for storing "Assembler" program may be much larger than the ROM volume required for storing the C++ program.

Alternatively, the C++ program may be stored in the ROM 318 as it is (i.e., without being translated into a low-level programming language). With this method, a very complex CONTROL DEVICE 302 needs to be generated to evaluate C++ commands. However, on the other hand, the speed of program performance may be enhanced, and the volume of the C++ PROGRAM ROM 318 may be reduced.

It is understood that FIG. 3 is intended as an example of an IC that may be created according to the present invention and not as an architectural limitation to the present invention. Those of ordinary skill in the art will appreciate that various combinations and arrangements may be employed without departing from the scope and spirit of the present invention.

F. Advantages of Present Invention

The present invention may have the following advantages. First, an IC may be specifically created to evaluate a specific C++ description. Thus, the IC of the present invention may only contain so many memories as needed for performing a given C++ program, leading to a small chip area. In addition, a CONTROL DEVICE of the IC may be not complicated because the CONTROL DEVICE is developed to execute commands of a given C++ program only.

Moreover, because IC of the present invention may keep values of different inputs, outputs and variables in different memories, it is possible to access (read and write) all these values in parallel and thus the time required for the C++ program execution may be reduced, resulting in enhanced performance.

It is understood that although an IC of the present invention is used for evaluating a C++ description, those of ordinary skill in the art will appreciate that an IC of the present invention may also be used for evaluating a description written in other programming languages without departing from the scope and the spirit of the present invention.

It is understood that the specific order or hierarchy of steps in the processes disclosed is an example of exemplary approaches. Based upon design preferences, it is understood that the specific order or hierarchy of steps in the processes may be rearranged while remaining within the scope of the present invention. The accompanying method claims present elements of the various steps in a sample order, and are not meant to be limited to the specific order or hierarchy presented.

It is believed that the present invention and many of its attendant advantages will be understood by the foregoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A method for evaluating a C++ description by an integrated circuit, comprising:
   providing a C++ description including a C++ program;
   storing said C++ program in a first memory module of an integrated circuit;
   providing at least one of a scalar input and an input array to said integrated circuit;
   executing said C++ program by a control device module of said integrated circuit;
   reading at least one of a scalar output and an output array from said integrated circuit; and
   storing each of said at least one of a scalar input and an input array, each of at least one of a scalar variable, a variable array, and a constant array, and each of said at least one of a scalar output and an output array into a separate memory module of said integrated circuit.

2. The method of claim 1, further comprising:
   generating a first value at an output port of said integrated circuit by said control device module when said control device module executes said C++ program, said first value indicating said integrated circuit is busy; and
   generating a second value at said output port of said integrated circuit by said control device module when said control device module finishes execution of said C++ program, said second value indicating said integrated circuit is available.

3. The method of claim 1, wherein said storing said C++ program step comprises:
   translating said C++ program into a new program including low-level programming language commands; and
   storing said new program into said first memory module.

4. The method of claim 3, wherein said low-level programming language commands are commands of Assembler programming language.

5. The method of claim 1, wherein said executing step is triggered when said control device module receives a value from an input port of said integrated circuit.

6. The method of claim 1, wherein said executing step comprising:
   outputting an address by said control device module to said first memory module, wherein said address represents a command number;
   outputting a command corresponding to said address by said first memory module to said control device module;
   executing said command by said control device module; and
   managing at least one of reading and writing of said at least one of a scalar input and an input array, at least one of a scalar variable, a variable array, and a constant array, and said at least one of a scalar output and an output array by said control device module.

7. The method of claim 6, further comprising:
   calculating an address of a next command to be executed at a next clock cycle by said control device module.

8. An apparatus for evaluating a C++ description by an integrated circuit, comprising:
   means for providing a C++ description including a C++ program;
   means for storing said C++ program in a first memory module of an integrated circuit;
   means for providing at least one of a scalar input and an input array to said integrated circuit;
   means for executing said C++ program by a control device module of said integrated circuit;
   means for reading at least one of a scalar output and an output array from said integrated circuit; and
   means for storing each of said at least one of a scalar input and an input array, each of at least one of a scalar variable, a variable array, and a constant array, and each of said at least one of a scalar output and an output array into a separate memory module of said integrated circuit.

9. The apparatus of claim 8, further comprising:
   means for generating a first value at an output port of said integrated circuit by said control device module when said control device module executes said C++ program, said first value indicating said integrated circuit is busy; and
   means for generating a second value at said output port of said integrated circuit by said control device module when said control device module finishes execution of said C++ program, said second value indicating said integrated circuit is available.

10. The apparatus of claim 8, wherein said means for storing said C++ program comprises:
    means for translating said C++program into a new program including low-level programming language commands; and
    means for storing said new program into said first memory module.

11. The apparatus of claim 10, wherein said low-level programming language commands are commands of Assembler programming language.

12. The apparatus of claim 8, wherein said control device module starts execution of said C++ program when said control device module receives a value from an input port of said integrated circuit.

13. The apparatus of claim 8, wherein said means for executing comprising:

means for outputting an address by said control device module to said first memory module, wherein said address represents a command number;

means for outputting a command corresponding to said address by said first memory module to said control device module;

means for executing said command by said control device module; and means for managing at least one of reading and writing of said at least one of a scalar input and an input array, at least one of a scalar variable, a variable array, and a constant array, and said at least one of a scalar output and an output array by said control device module.

14. The apparatus of claim 13, further comprising:

means for calculating an address of a next command to be executed at a next clock cycle by said control device module.

15. An integrated circuit for evaluating a C++ description including a C++ program, comprising:

a first memory module for storing a C++ program;

a plurality of memory modules, wherein each of at least one of a scalar input and an input array, each of at least one of a scalar variable, a variable array, and a constant array, and each of at least one of a scalar output and an output array are stored separately into each of said a plurality of memory modules; and a control device module, communicatively coupled to said first memory module and said each of said a plurality of memory modules, for executing said C++ program and for managing at least one of reading and writing of said each of at least one of a scalar input and an input array, said each of at least one of a scalar variable, a variable array, and a constant array, and said each of at least one of a scalar output and an output array.

16. The integrated circuit of claim 15, wherein said first memory module is read-only memory.

17. The integrated circuit of claim 15, further comprising an output port communicatively coupled to said control device module, wherein said control device module generates a first value at said output port when said control device module executes said C++ program, said first value indicating said integrated circuit is busy, and wherein said control device module generates a second value at said output port when said control device module is not executing said C++ program, said second value indicating said integrated circuit is available.

18. The integrated circuit of claim 15, further comprising an input port communicatively coupled to said control device module, wherein a value at said input port starts execution of said C++ program by said control device module.

* * * * *